United States Patent
Chen et al.

(10) Patent No.: US 11,676,774 B2
(45) Date of Patent: Jun. 13, 2023

(54) SOLAR CELL MODULE, MANUFACTURING METHOD THEREOF, AND PHOTOVOLTAIC MODULE

(71) Applicant: ZHEJIANG JINKO SOLAR CO., LTD., Zhejiang (CN)

(72) Inventors: Chen Chen, Zhejiang (CN); Bairu Li, Zhejiang (CN); Menglei Xu, Zhejiang (CN); Jie Yang, Zhejiang (CN); Xinyu Zhang, Zhejiang (CN); Hao Jin, Zhejiang (CN)

(73) Assignee: ZHEJIANG JINKO SOLAR CO., LTD., Zhejiang (CN)

( * ) Notice: Subject to any disclaimer, the term of this patent is extended or adjusted under 35 U.S.C. 154(b) by 0 days.

(21) Appl. No.: 17/548,121

(22) Filed: Dec. 10, 2021

(65) Prior Publication Data
US 2023/0141956 A1  May 11, 2023

(30) Foreign Application Priority Data
Nov. 10, 2021  (CN) .......................... 202111327688.0

(51) Int. Cl.
  *H01G 9/20* (2006.01)
  *H01G 9/00* (2006.01)
  *H01L 31/046* (2014.01)

(52) U.S. Cl.
  CPC ......... *H01G 9/2081* (2013.01); *H01G 9/0029* (2013.01); *H01G 9/2022* (2013.01); *H01L 31/046* (2014.12)

(58) Field of Classification Search
CPC ... H01L 31/046; H01G 9/2022; H01G 9/2028
See application file for complete search history.

(56) References Cited

U.S. PATENT DOCUMENTS

| 2015/0287843 | A1* | 10/2015 | Cheng | H01L 31/046 |
| | | | | 438/95 |
| 2020/0294728 | A1* | 9/2020 | Zhu | H01L 51/42 |
| 2021/0104367 | A1* | 4/2021 | Tanaka | H01G 9/2059 |

FOREIGN PATENT DOCUMENTS

| CN | 102214518 | 10/2011 |
| CN | 105206751 | 12/2015 |

(Continued)

OTHER PUBLICATIONS

Extended European Search Report (App. No. 21213761.6) dated May 23, 2022 (7 pages).

(Continued)

*Primary Examiner* — Bethany L Martin
(74) *Attorney, Agent, or Firm* — Nixon Peabody LLP; Jeffrey L. Costellia

(57) ABSTRACT

Provided is a solar cell module and a manufacturing method thereof, and a photovoltaic module. The solar cell module includes a substrate; and conductive layers arranged on a surface of the substrate and separated from each other. Solar sub-cells are provided on a surface of the conductive layer. Grooves are provided between adjacent solar sub-cells to separate the solar sub-cells from each other. Each of the solar sub-cells includes a hole transport layer, a perovskite layer and an electron transport layer that are stacked on the surface of the conductive layer. The hole transport layer of each solar sub-cell includes branch electrodes separated from each other. Each of the branch electrodes contacts an interior of the conductive layer. The solar cell module further includes an electrode. The electrode successively passes through the electron transport layer and the perovskite layer and is connected to the branch electrodes.

18 Claims, 5 Drawing Sheets

(56) References Cited

FOREIGN PATENT DOCUMENTS

| CN | 106229327 | 12/2016 |
| CN | 110635051 | 12/2019 |
| CN | 212257425 | 12/2020 |
| WO | WO-2019/181330 | 9/2019 |
| WO | WO-2020/067188 | 4/2020 |

OTHER PUBLICATIONS

Chinese Office Action for Application No. 202111327688.0, dated Dec. 30, 2021 (9 pages).

* cited by examiner

SOLAR CELL MODULE, MANUFACTURING METHOD THEREOF, AND PHOTOVOLTAIC MODULE

CROSS-REFERENCE TO RELATED APPLICATIONS

The present application claims priority to Chinese Patent Application No. 202111327688.0, filed on Nov. 10, 2021, the content of which is incorporated herein by reference in its entirety.

TECHNICAL FIELD

The present disclosure relates to the technical field of photovoltaic cells, and in particular, to a solar cell module and a manufacturing method thereof, and a photovoltaic module.

BACKGROUND

With the aggravation of energy crisis and environmental pollution, the demand for renewable energy is increasing. Solar energy is safe, pollution-free and not limited by geographical conditions, and thus is one of the most widely used and promising renewable energy. Photovoltaic power generation is undoubtedly one of the most promising directions in a variety of technologies making efficient use of the solar energy. Among many new solar cells, perovskite solar cells are one of the most promising solar cells with excellent photoelectric conversion performance, abundant raw materials and a simple manufacturing process.

A conventional perovskite solar cell module is a solar cell using a perovskite organic metal halide semiconductor as a light absorption material. The perovskite solar cells have a high photoelectric conversion efficiency, a simple production process, and low manufacturing costs and material costs. In order to further improve the conversion efficiency of the solar energy, connection regions of solar sub-cells in the conventional perovskite solar cell assembly are required to be further improved.

SUMMARY

In view of the above, the present disclosure provides a solar cell module and a manufacturing method thereof, and a photovoltaic module. The solar cell module has excellent conductivity and can improve conversion efficiency of solar cells.

In a first aspect, the present disclosure provides a solar cell module. The solar cell module includes a substrate; and a plurality of conductive layers arranged on a surface of the substrate and separated from each other. A plurality of solar sub-cells is provided on a surface of the conductive layer. A plurality of grooves is provided between adjacent solar sub-cells of the plurality of solar sub-cells to separate the plurality of solar sub-cells from each other. Each of the plurality of solar sub-cells includes a hole transport layer, a perovskite layer and an electron transport layer that are stacked on the surface of the conductive layer. The hole transport layer of each of the plurality of solar sub-cells includes a plurality of branch electrodes separated from each other. Each of the plurality of branch electrodes contacts an interior of the conductive layer. The solar cell module further includes an electrode. The electrode successively passes through the electron transport layer and the perovskite layer and is connected to the plurality of branch electrodes.

In a second aspect, the present disclosure provides a method for manufacturing a solar cell module, including: providing a substrate and forming a plurality of conductive layers that are separated from each other on a surface of the substrate; forming a plurality of solar sub-cells on a surface of the conductive layer, and forming a plurality of grooves between adjacent solar sub-cells of the plurality of solar sub-cells, each of the solar sub-cells includes a hole transport layer, a perovskite layer and an electron transport layer that are stacked on the surface of the conductive layer; forming a plurality of branch electrodes that are separated from each other in the hole transport layer of each of the solar sub-cells so that the branch electrodes contact with an interior of the conductive layer; and forming an electrode passing through the electron transport layer and the perovskite layer and connecting the electrode to the plurality of branch electrodes.

In a third aspect, the present disclosure provides a photovoltaic module, including a cover plate, a capsulation material layer and a solar cell string, and the solar cell string includes the solar cell module according to the first aspect or a solar cell module manufactured according to the method in the second aspect.

BRIEF DESCRIPTION OF DRAWINGS

In order to better illustrate the technical solutions in embodiments of the present disclosure or the related art, the accompanying drawings used in the description of the embodiments or the related art will be briefly introduced below. It is apparent that the accompanying drawings in the following description are only some embodiments of the present disclosure, and other drawings can be obtained by those of ordinary skill in the art from the provided drawings without creative efforts.

DESCRIPTION OF EMBODIMENTS

In order to better understand the technical solutions of the present disclosure, the following is a detailed description of the embodiments of the present disclosure with reference to the accompanying drawings.

It should be made clear that the embodiments described are only part of rather than all of the embodiments of the present disclosure. All other embodiments acquired by those of ordinary skill in the art without creative efforts based on the embodiments of the present disclosure shall fall within the protection scope of the present disclosure.

The terms used in the specification of the present disclosure are intended only to describe particular embodiments and are not intended to limit the present disclosure. As used in the embodiments of the present disclosure and the appended claims, the singular forms of "a/an", "the", and "said" are intended to include plural forms, unless otherwise clearly specified by the context.

It is to be understood that the term "and/or" used herein is merely an association relationship describing associated objects, indicating that three relationships may exist. For example, A and/or B indicates that there are three cases of A alone, A and B together, and B alone. In addition, the character "I" herein generally means that associated objects before and after "/" are in an "or" relationship.

In the conventional perovskite solar cell module, solar sub-cells of a perovskite solar cell assembly are connected to each other by cutting. When the performance of the solar sub-cells is normal, connection regions of the solar sub-cells become a key factor affecting the perovskite solar cell assembly. Serial resistance of the connection regions of the solar sub-cells affects the conductivity of the connection regions of the solar sub-cells, and the conductivity of the connection regions of the solar sub-cells determines the performance of the perovskite solar cell assembly. In order to further improve the conversion efficiency of solar energy, connection regions of the solar sub-cells of the conventional perovskite solar cell assembly are required to be further improved.

Figure 1:
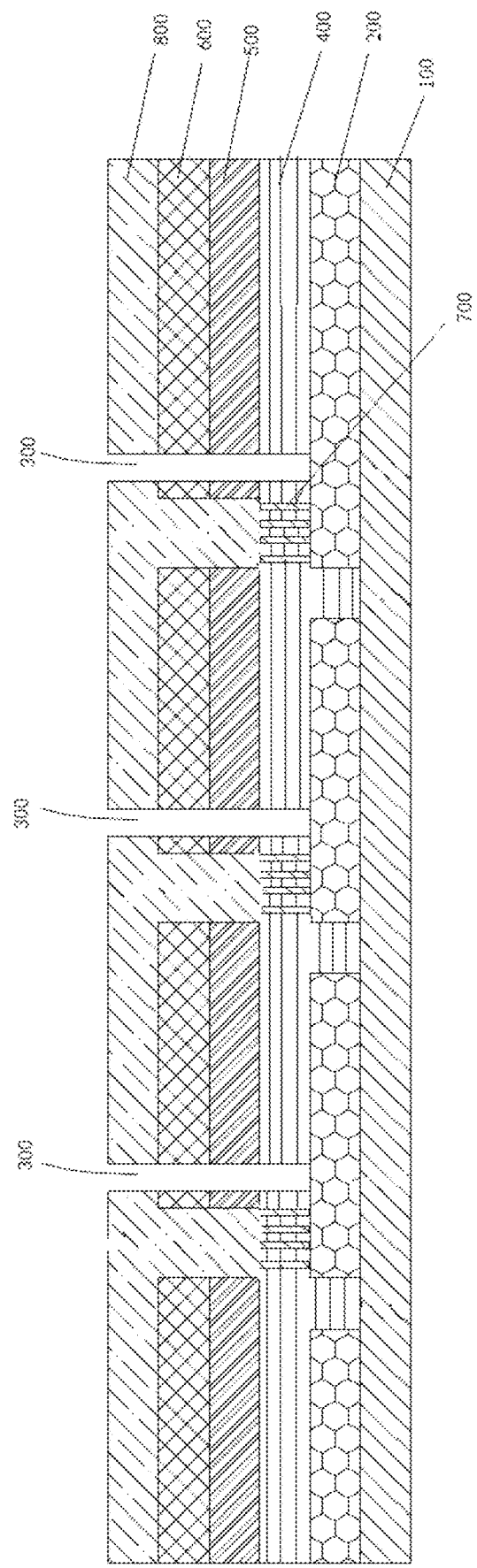
FIG. 1 is a front sectional view of a solar cell module according to the present disclosure.

The present disclosure provides a solar cell module. FIG. 1 is a front sectional view of a solar cell according to the present disclosure. The solar cell module includes: a substrate 100 and a plurality of conductive layers 200 arranged on a surface of the substrate 100 and separated from each other.

A surface of the conductive layer 200 is provided with a plurality of solar sub-cells, and grooves 300 are provided between adjacent ones of the solar sub-cells to separate the solar sub-cells from one another. Each of the solar sub-cells includes a hole transport layer 400, a perovskite layer 500 and an electron transport layer 600 that are stacked on the surface of the conductive layer 200. The hole transport layer 400 of each of the solar sub-cells includes a plurality of branch electrodes 700 separated from one another.

The solar cell module further includes an electrode 800. The electrode 800 successively passes through the electron transport layer 600 and the perovskite layer 500 to be connected to the branch electrodes 700.

According to the present disclosure, the plurality of branch electrodes 700 are arranged in the hole transport layer 400 and separated from one another, and each of the branch electrodes 700 contacts the interior of the conductive layer 200, which increases an area of contact between a total electrode and the conductive layer 200, improves the conductivity, reduces series resistance of the solar cell module, improves charge transport capability, and increases short-circuit density of the solar cell module as well as a filling factor, thereby effectively improving photoelectric conversion efficiency of the solar cell module. It may be understood that the term "total electrode" refers to a conductive medium of the solar cell module, and is a general name of the electrode 800 and the branch electrode 700.

In some embodiments, the solar sub-cells are arranged on a substrate 100. Adjacent sub-cells are connected in series to form a serial solar cell module, which can prevent a high recombination rate caused by carrier path growth and obtain a high-performance solar cell module.

In some embodiments, the solar cell module according to the present disclosure successively includes the substrate 100, the conductive layer 200, the hole transport layer 400, the perovskite layer 500, the electron transport layer 600, the branch electrode 700 and the electrode 800 from a light receiving front surface to a light receiving back surface. The branch electrode 700 passes through the hole transport layer 400 and part of the conductive layer 200, so that the electrode 800, the branch electrode 700 and the conductive layer 200 contact to form a connection path, thereby reducing series resistance of the solar cell module and improving performance of the solar cell module.

Figure 2:
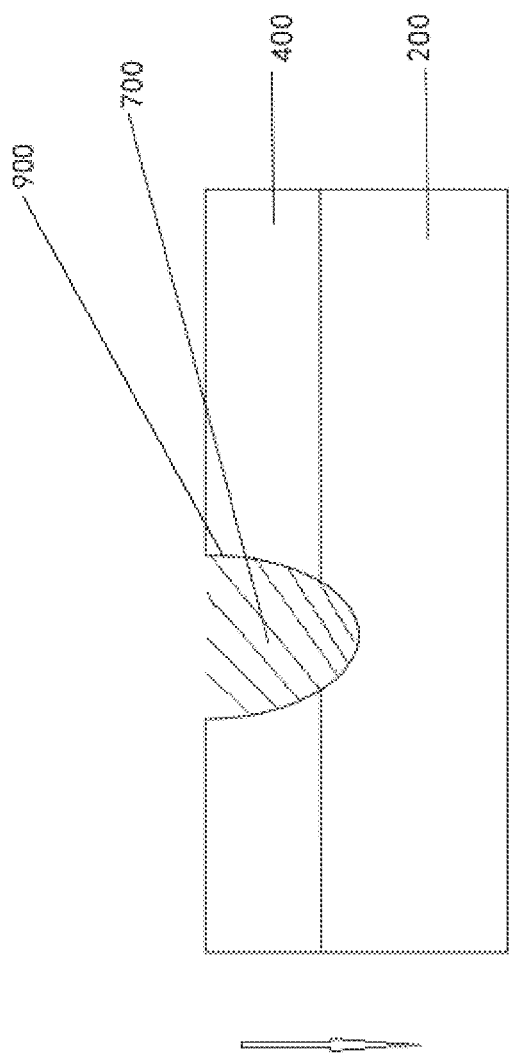
FIG. 2 is a side view of a branch electrode, a hole transport layer and a conductive layer according to the present disclosure.

In some embodiments, as shown in FIG. 2, a height of the branch electrode 700 is set to H, a height of the hole transport layer 400 is set to h1, a height of the conductive layer 200 is set to h2. The height H of the branch electrode 700, the height h1 of the hole transport layer 400 and the height h2 of the conductive layer 200 satisfy the following relation:

$$h1 < H < h1 + h2 \times (10\%\text{-}60\%).$$

In the above technical solutions, the height H of the branch electrode 700 is controlled within the above range to ensure that the branch electrode 700 runs through the hole transport layer 400 and extends into the conductive layer 200, so that the branch electrode 700 passes through the hole transport layer 400 to contact interior of the conductive layer 200, so as to increase an area of contact between the total electrode and the conductive layer 200, thereby reducing series resistance of the solar cell module and improving performance of the solar cell module. If the branch electrode 700 contacts a surface of the conductive layer 200, the series resistance is excessive low to improve the conversion efficiency of solar energy. If the branch electrode 700 does not run through the hole transport layer 400 and the branch electrode 700 contacts the hole transport layer 400, the series resistance is excessive high, resulting in degradation of the performance of the solar cell. In some embodiments, the height H of the branch electrode 700 is $h1 < H < h1 + h2 \times (30\%\text{-}40\%)$, which can further improve the performance of the solar cell module.

In some embodiments, the height h1 of the hole transport layer 400 ranges from 1 nm to 200 nm, the height h2 of the conductive layer 200 ranges from 100 nm to 1000 nm, and thus the height of the branch electrode 700 ranges from 2 nm to 500 nm. The height H of the branch electrode 700 may be, for example, 2 nm, 20 nm, 45 nm, 55 nm, 80 nm, 100 nm, 110 nm, 150 nm, 180 nm, 240 nm 300 nm, 350 nm, 400 nm, 460 nm or 500 nm. The height of the branch electrode 700 is controlled within the above range, which helps to improve photoelectric conversion efficiency of the solar cell module.

In some embodiments, as shown in FIG. 2, along a cutting direction in FIG. 2, a profile shape of the branch electrode 700 includes at least one of a cone, a cylinder, a rectangle or an ellipse. In some embodiments, the profile shape of the branch electrode 700 is a cone. When the shape of the branch electrode 700 is a cone, it is generally configured as a half cone, with the purpose of enabling the branch electrode 700 to form good contact with the conductive layer 200 and of increasing an area of contact between the total electrode and the conductive layer 200.

In some embodiments, even distribution of the branch electrode 700 in the hole transport layer 400 facilitates better transport of charges.

In some embodiments, a one-dimensional size of the branch electrode 700 is $0 < L \leq 3$ μm. It may be understood that the one-dimensional size of the branch electrode 700 refers to a value of a diameter or length of countless planes obtained by horizontally cutting the branch electrode 700. The planes obtained by cutting may be in a shape of, for example, a circle, an irregular circle or a rectangle. The value is not 0. The one-dimensional size of the branch electrode 700 may be, for example, 0.5 µm, 1 µm, 1.5 µm, 2 µm, 2.5 µm or 3 µm. The one-dimensional size of the branch electrode 700 is controlled within the above range, which facilitates better contact of the electrode with the bottom conductive layer 200. In some embodiments, the one-dimensional size of the branch electrode 700 ranges from 1 µm to 3 µm.

In some embodiments, an area ratio of a cross section of the branch electrode 700 to a cross section of the electrode 800 located in the perovskite layer 500 ranges from 0.1 to 0.3, and the cross section of the branch electrode 700 is a cross section formed by the branch electrode 700 on a surface of the hole transport layer 400. The area ratio of the cross section of the branch electrode 700 to the cross section of the electrode 800 located in the perovskite layer 500 may be, for example, 0.1, 0.12, 0.15, 0.20, 0.23, 0.25, 0.28 or 0.3. The area ratio of the cross section of the branch electrode 700 to the cross section of the electrode 800 located in the perovskite layer 500 is controlled within the above range, which helps to control the series resistance within an effective range. It may be understood that the cross section of the branch electrode 700 refers to a sum of areas of all the branch electrodes 700 on a same plane.

In some embodiments, a width of the electrode 800 located in the perovskite layer 500 ranges from 50 µm to 200 µm. The width of the electrode 800 located in the perovskite layer 500 may be, for example, 50 µm, 60 µm, 70 µm, 80 µm, 90 µm, 100 µm, 110 µm, 120 µm, 130 µm, 140 µm, 150 µm, 160 µm, 170 µm, 180 µm, 190 µm or 200 µm. If the width of the electrode 800 located in the perovskite layer 500 is less than 50 µm, it is not conducive to charge transport. If the width of the electrode 800 located in the perovskite layer 500 is greater than 200 µm, an effective area of the solar cell is greatly reduced, thereby bringing adverse effects to the efficiency of the solar cell.

In some embodiments, a width of a single solar sub-cell ranges from 5 mm to 8 mm, and grooves are arranged between adjacent solar sub-cells for separation. If the width of a single solar sub-cell is smaller than 5 mm, there are too many grooves, which reduces the effective area of the solar cell. If the width of a single solar sub-cell is greater than 8 mm, it is not conducive to transport charges.

In some embodiments, serial resistance between adjacent solar sub-cells ranges from 2 $\Omega \cdot cm^2$ to 4 $\Omega \cdot cm^2$. The serial resistance between adjacent solar sub-cells may be, for example, 2 $\Omega \cdot cm^2$, 3 $\Omega \cdot cm^2$ or 4 $\Omega \cdot cm^2$. Compared with a conventional solar cell, in the present disclosure, the serial resistance between adjacent solar sub-cells is low, indicating that the solar cell has good conductivity, which can increase short-circuit current density and a filling factor of the solar cell and further improve the conversion efficiency of solar energy.

Figure 3:
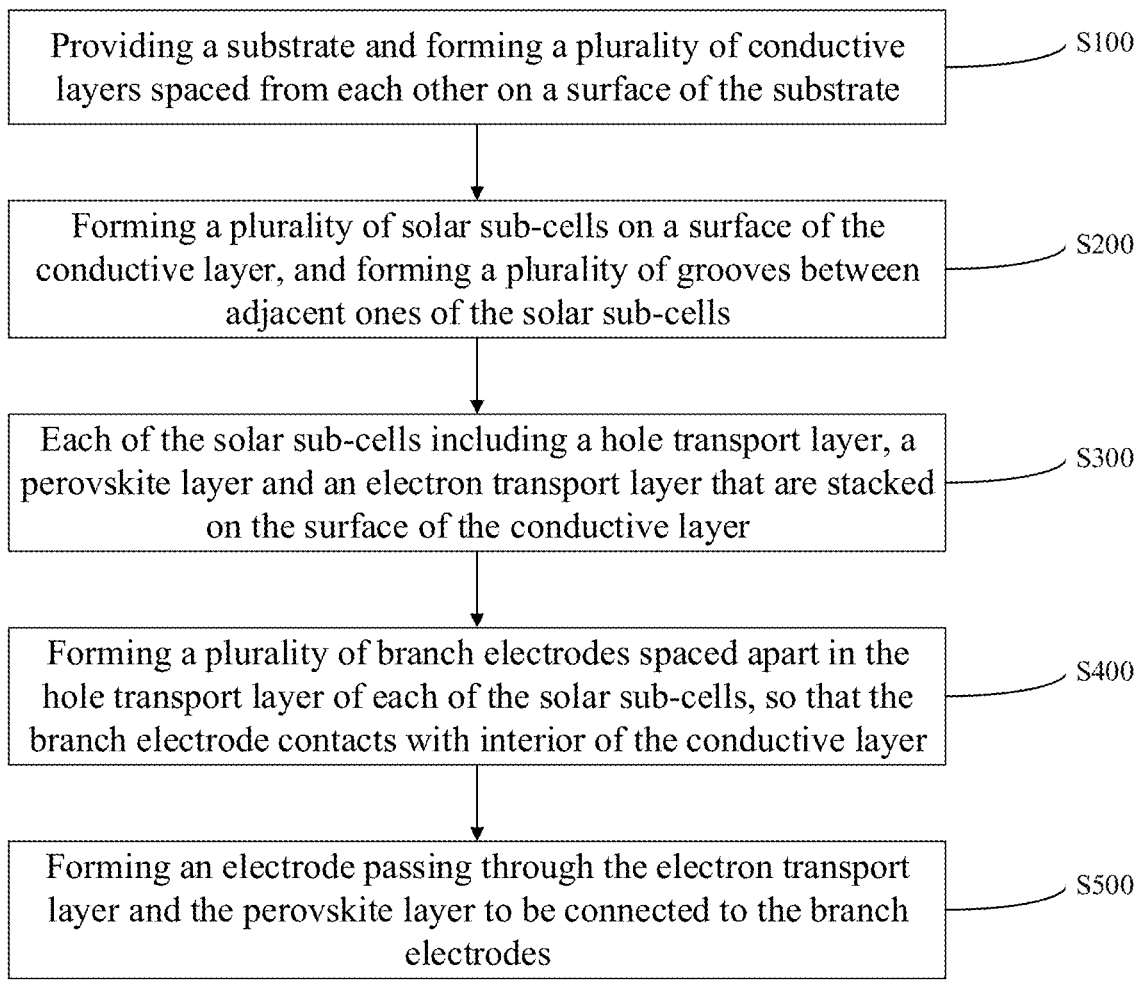
FIG. 3 is a flowchart of a manufacturing process of a solar cell module according to the present disclosure.

As shown in FIG. 3, the present disclosure further provides a manufacturing method of the solar cell module, including the following steps.

In step S100, a substrate 100 is provided and a plurality of conductive layers 200 separated from each other are formed on a surface of the substrate 100.

In step S200, a plurality of solar sub-cells on a surface of the conductive layer 200, and grooves 300 are formed between adjacent ones of the solar sub-cells.

In step S300, each of the solar sub-cells includes a hole transport layer 400, a perovskite layer 500 and an electron transport layer 600 stacked on the surface of the conductive layer 200.

In step S400, a plurality of branch electrodes 700 separated from each other are formed in the hole transport layer 400 of each of the solar sub-cells, and the branch electrode 700 contacts the interior of the conductive layer 200.

In step S500, an electrode 800 connected to the branch electrode 700 is formed by passing through the electron transport layer 600 and the perovskite layer 500.

According to the present disclosure, the plurality of branch electrodes 700 separated from each other are arranged in the hole transport layer 400, and the branch electrode 700 contacts the interior of the conductive layer 200, which increases an area of contact between a total electrode (the branch electrode 700 and the electrode 800) and the conductive layer 200, thereby reducing series resistance of the solar cell module and improving performance of the solar cell module.

It may be understood that the solar cell module according to the present disclosure is a perovskite solar cell (PSC) module, that is, a solar cell using a perovskite organic metal halide semiconductor as a light absorption material, which may be of a nip structure or a pin structure. The nip structure refers to the substrate 100, the conductive layer 200, the electron transport layer 600, the perovskite layer 500, the hole transport layer 400, the branch electrode 700 and the electrode 800 successively arranged. The pin structure refers to the substrate 100, the conductive layer 200, the hole transport layer 400, the perovskite layer 500, the electron transport layer 600, the branch electrode 700 and the electrode 800 successively arranged. The manufacturing method according to the present disclosure is illustrated by taking the pin structure as an example. Regardless of the nip structure or the pin structure, any modifications, equivalent substitutions, improvements and the like made by any person skilled in the art without departing the concept of the present disclosure should fall within the protection scope of the present disclosure.

The manufacturing method according to the present disclosure is described below according to one or more embodiments.

In step S100, a substrate 100 is provided and a plurality of conductive layers 200 separated from each other are formed on a surface of the substrate 100.

In some embodiments, the substrate 100 is a carrier of the solar sub-cells and the conductive layer 200, so the substrate 100 is also referred to as a base.

In some embodiments, the substrate 100 may be made of glass or a flexible film substrate. The flexible film substrate may be made of, for example, polyethylene terephthalate (PET) or polyethylene naphthalate (PEN). The substrate 100 is non-conductive. Generally, the substrate 100 and the conductive layer 200 are collectively referred to as conductive glass.

In some embodiments, prior to the manufacturing of the conductive layer 200, the substrate 100 is pretreated with, for example, deionized water, detergent, acetone, isopropyl alcohol, anhydrous ethanol and the like.

In some embodiments, firstly, a whole conductive layer is formed on the surface of the substrate 100 by sputtering, and then the whole conductive layer is cut to form a plurality of conductive layers 200 separated from each other.

In some embodiments, the conductive layer 200 is made of at least one of indium tin oxide, fluorine-doped tin oxide or aluminum-doped zinc oxide.

In some embodiments, the plurality of conductive layers 200 separated from each other are formed by laser etching. It is to be noted that laser etching of the perovskite solar cell module requires guarantee of accuracy of a laser etching line width and a laser etching line spacing during the etching of the conductive layer 200 (for example, fluorine-doped tin oxide (FTO)), without damages to the substrate 100.

In some embodiments, a thickness of the conductive layer 200 ranges from 100 nm to 1000 nm. The thickness of the conductive layer 200 may be, for example, 100 nm, 200 nm, 300 nm, 400 nm, 500 nm, 600 nm, 700 nm, 800 nm, 900 nm or 1000 nm.

In some embodiments, a distance between two adjacent conductive layers 200 ranges from 30 μm to 200 μm. The distance between two adjacent conductive layers 200 may be, for example, 30 μm, 40 μm, 50 μm, 60 μm, 70 μm, 80 μm, 90 μm, 100 μm, 120 μm, 150 μm, 170 μm, 190 μm or 200 μm. The formation of the plurality of conductive layers 200 separated from one another is intended to form insulation bands between several conductive layers 200, so as to facilitate the formation of a plurality of solar sub-cells on the conductive layers 200 during subsequent manufacturing.

In step S200, a plurality of solar sub-cells on a surface of the conductive layer 200, and grooves 300 are formed between adjacent ones of the solar sub-cells.

In some embodiments, the groove 300 may be formed by laser etching or mechanical cutting.

In some embodiments, a width of the groove 300 ranges from 30 nm to 200 nm. The width of the groove 300 may be, for example, 30 nm, 50 nm, 80 nm, 100 nm, 120 nm, 156 nm, 170 nm, 180 nm, 195 nm or 200 nm.

In step S300, each of the solar sub-cells includes a hole transport layer 400, a perovskite layer 500 and an electron transport layer 600 stacked on the surface of the conductive layer 200.

In some embodiments, the hole transport layer 400 refers to a layer that extracts and transports holes in photogenerated excitons of the perovskite layer 500, including, but not limited to, an organic material and an inorganic material. In some embodiments, the organic material includes at least one of 2,2', 7,7'-Tetrakis[N,N-di(4-methoxyphenyl)amino]-9,9'-spirobifluorene (Spiro-OMeTAD), poly[bis(4-phenyl)(2,4,6-trimethylphenyl)amine] (PTAA) and poly3-hexylthiophene (P3HT). The inorganic material includes at least one of CuI, CuSCN, $TiO_2$ or $SnO_2$.

In some embodiments, a thickness of the hole transport layer 400 ranges from 1 nm to 200 nm. The thickness of the hole transport layer 400 may be, for example, 1 nm, 5 nm, 10 nm, 20 nm, 50 nm, 80 nm, 100 nm, 120 nm, 156 nm, 170 nm, 180 nm, 195 nm or 200 nm. The thickness of the hole transport layer 400 is controlled within the above range, which helps increase an open-circuit voltage and a filling factor.

In some embodiments, the hole transport layer 400 is formed by at least one of magnetron sputtering, high-temperature spraying or spin coating.

Perovskite solar cells refer to solar cells manufactured with the perovskite layer 500. Perovskite in the perovskite layer 500 refers to crystalline materials having $ABX_3$ and similar structures.

A is a monovalent cation, including, but not limited to, at least one of $Rb^+$, $Na^+$, $K^+$, $Cs^+$, $HN=CHNH_3^+$ (expressed as FA) and $CH_3NH_3^+$ (expressed as MA).

B is a divalent cation, including, but not limited to, at least one of $Sn^{2+}$ and $Pb^{2+}$.

X is selected from at least one of halogen anions (for example, $F^-$, $Cl^-$ and $Br^-$), $O^{2-}$ or $S^{2-}$.

In this structure, B is located at a center of a cubic cell body, X is located at a center of a cube surface, and A is located at a vertex of the cube. The structure of the perovskite solar cells is more stable than a structure connected in a colloid or coplanar form, which is conducive to diffusion and migration of defects.

The perovskite layer for the present disclosure includes, but is not limited to, at least one of, for example, $CH_3NH_3PbI_3$, $(Cs)_x(FA)_{1-x}PbI_3$, $(FA)_x(MA)_{1-x}PbI_3$, $(FA)_x(MA)_{1-x}PbI_yCl_{1-y}$ and $(FAPbI_3)_x(MAPbBr_3)_{1-x}$, where x=0~1 and y=0~1.

When exposed to sunlight, the perovskite layer 500 first absorbs photons and generates electron-hole pairs. The carriers either become free carriers or form excitons due to a difference in binding energy of perovskite excitons. Moreover, the perovskite materials generally have lower carrier recombination probability and higher carrier mobility, so the carriers have longer diffusion distance and lifetime. For example, a carrier diffusion length of $CH_3NH_3PbI_3$ is at least 100 nm. A diffusion length of $CH_3NH_3PbI_{3-x}Cl_x$ is even greater than 1 μm, where x=0~1. The solar cell module manufactured with the perovskite layer can obtain excellent performance. In an embodiment, the perovskite layer 500 is made of ($CH_3NH_3PbI_3$).

In some embodiments, a thickness of the perovskite layer 500 ranges from 300 nm to 800 nm. The thickness of the perovskite layer 500 may be, for example, 300 nm, 350 nm, 380 nm, 420 nm, 480 nm, 500 nm, 600 nm, 630 nm, 680 nm, 700 nm, 720 nm, 750 nm or 800 nm. The thickness of the perovskite layer 500 is controlled within the above range, which facilitates absorption of light and inhibits recombination of carriers.

In some embodiments, the perovskite layer 500 is formed by at least one of spin coating, spraying, scraping or evaporation.

The perovskite layer 500 according to the present disclosure is inexpensive and solubilizable, making it easier to manufacture than traditional silicon solar cells by using a roll-to-roll technology that does not require vacuum conditions.

The electron transport layer 600 (ETM) refers to a layer that extracts and transports electrons from photogenerated excitons of the perovskite layer 500, including, but not limited to, an inorganic material or a polymer material. In some embodiments, the inorganic material includes at least one of ZnO and MoO3. The polymer material includes at least one of a fullerene derivative (PCBM) and C60.

In some embodiments, a thickness of the electron transport layer 600 ranges from 10 nm to 50 nm. The thickness of the electron transport layer 600 may be, for example, 10 nm, 15 nm, 20 nm, 25 nm, 30 nm, 35 nm, 40 nm, 45 nm or 50 nm. The thickness of the electron transport layer 600 is controlled within the above range, which is conducive to electron transport.

In some embodiments, the electron transport layer 600 is formed by at least one of spraying, scraping, evaporation and spin coating.

It may be understood that the hole transport layer 400, the perovskite layer 500 and the electron transport layer 600 may be manufactured by a same method or by different methods.

In step S400, a plurality of branch electrodes 700 separated from each other in the hole transport layer 400 of each of the solar sub-cells, and the branch electrode 700 contacts the interior of the conductive layer 200.

Figure 4:
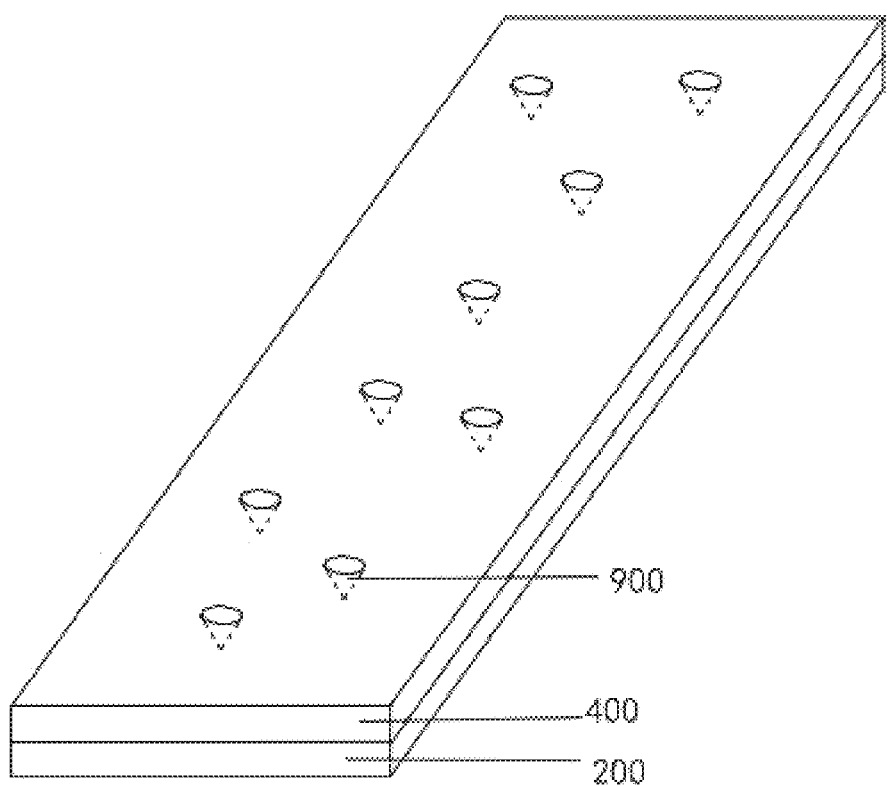
FIG. 4 is a schematic structural diagram of holes in a hole transport layer and a conductive layer according to the present disclosure.
Figure 5:
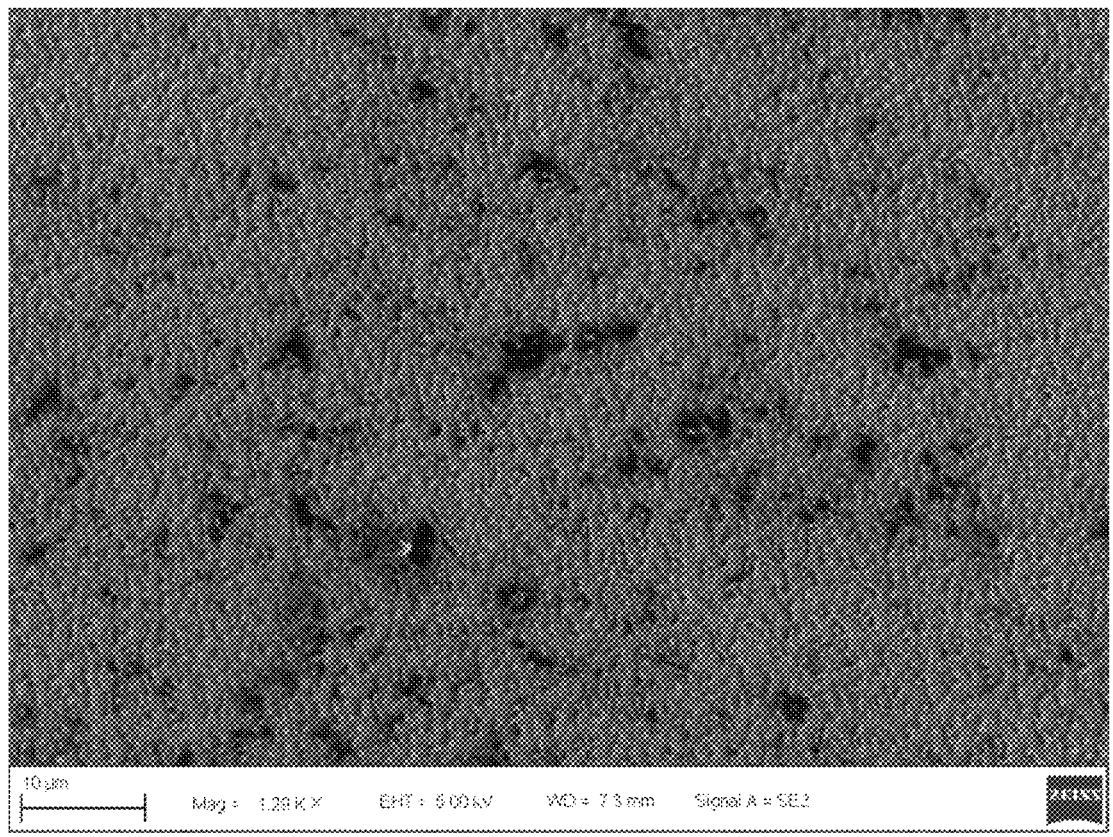
FIG. 5 is a scanning electron micrograph of holes formed by laser cutting according to the present disclosure.

In some embodiments, firstly, the electron transport layer 600 and the perovskite layer 500 in a preset region are removed to expose the hole transport layer 400, as shown in FIG. 4. Then, a plurality of holes 900 are formed on the exposed hole transport layer 400 by laser treatment. FIG. 5 is a schematic structural diagram and a scanning electron micrograph of holes formed by laser treatment. The holes 900 run through the hole transport layer 400 and extends into the conductive layer 200, and finally, the branch electrodes 700 are formed in the holes 900 and the branch electrode 700 contacts the interior of the conductive layer 200, which effectively reduces series resistance, improves charge transport capability, and increases short-circuit current density as well as a filling factor, thereby improving efficiency of the solar cell module. The preset region refers to a preset electrode region.

In some embodiments, in the present disclosure, the perovskite layer 500 in the preset region is removed to prevent corrosion caused by contact of the branch electrode 700 and the electrode 800 with the perovskite layer.

In some embodiments, the electron transport layer 600 and the perovskite layer 500 are removed from the preset region by at least one of laser etching or mechanical cutting.

In some embodiments, a width of the preset region ranges from 50 μm to 200 μm. It may be understood that the width of the preset region is a width of the removed electron transport layer 600 and perovskite layer 500. The width of the preset region may be, for example, 50 μm, 60 μm, 70 μm, 80 μm, 90 μm, 100 μm, 110 μm, 120 μm, 130 μm, 140 μm, 150 μm, 160 μm, 170 μm, 180 μm, 190 μm or 200 μm. If the width of the preset region is less than 50 μm, an area of contact between the electrode 800 and the branch electrode 700 is excessively small and the conductivity is poor, resulting in a decrease in the short-circuit current density. If the width of the preset region is greater than 200 μm, an effective area of a single solar sub-cell is reduced, resulting in degradation of the performance of the solar cell. It may be understood that (width of a solar sub-cell—width of a cutting region)/width of the solar sub-cell=effective area/total area. A width of the cutting region is a sum of the width of the groove 300 and the width of the preset region.

In some embodiments, laser for the laser treatment includes at least one of green light, ultraviolet light, reddish light or red light.

In some embodiments, a frequency of the laser treatment ranges from 60 kHz to 100 kHz. The frequency of the laser treatment may be, for example, 60 kHz, 65 kHz, 70 kHz, 75 kHz, 80 kHz, 85 kHz, 90 kHz, 95 kHz or 100 kHz. The frequency of the laser treatment is controlled within the above range, which can produce energy of 20 eV to 60 eV and is conducive to the formation of the holes 900.

In some embodiments, a speed of the laser treatment ranges from 200 m/s to 2000 m/s. The speed of the laser treatment may be, for example, 200 m/s, 300 m/s, 400 m/s, 500 m/s, 600 m/s, 700 m/s, 800 m/s, 900 m/s, 1000 m/s, 1100 m/s, 1200 m/s, 1300 m/s, 1400 m/s, 1500 m/s, 1600 m/s, 1700 m/s, 1800 m/s, 1900 m/s or 2000 m/s.

In step S500, an electrode 800 connected to the branch electrode 700 is formed by passing through the electron transport layer 600 and the perovskite layer 500. In the present disclosure, an electrode 800 connected to the branch electrode 700 is formed on a surface of the electron transport layer 600 and a surface of the hole transport layer 400, which can effectively reduce series resistance of the solar cell module, improve charge transport capability, and increase short-circuit density of the solar cell module as well as a filling factor, thereby effectively improving conversion efficiency of the perovskite solar cell module.

In some embodiments, the branch electrode 700 and the electrode 800 are made of at least one of titanium dioxide, tin dioxide, zinc oxide, nickel oxide and gold. The branch electrode 700 and the electrode 800 are made of the same material.

In some embodiments, the branch electrode 700 and the electrode 800 are formed by at least one of evaporation coating or magnetron sputtering.

In another aspect, a photovoltaic module is provided. The photovoltaic module includes a transparent cover plate, an upper capsulation layer, a solar cell string and a lower capsulation layer that are stacked. The stack structure is laminated. The photovoltaic module is obtained through electrical connections between wires and solar cell strings during the lamination. The solar cell string includes a plurality of solar cell modules described above. Each solar cell string includes a plurality of solar cell modules connected through conductive bands. The solar cell may be the solar cell module described above or a solar cell module manufactured with the manufacturing method described above.

In some embodiments, after the photovoltaic module is assembled, nitrogen is introduced and then the photovoltaic module is sealed.

The present disclosure are further described below through multiple embodiments. The present disclosure are not limited to the following embodiments. Variations may be made appropriately without changing the scope of the independent claims.

Embodiment 1

(1) A substrate 100 is provided, a whole conductive layer is sputtered on a surface of the substrate 100 on a magnetron sputtering instrument, which is sputtered for 1 h in a 150 mL/min argon atmosphere at sputtering power of 150 W. A plurality of conductive layers 200 separated from each other are formed by green laser etching on the whole conductive layer at power of 100 kHz to expose part of the substrate 100.

(2) A hole transport layer 400 is formed on surfaces of the conductive layer 200 and the exposed substrate 100 by spray pyrolysis, a perovskite layer 500 is formed on a surface of the hole transport layer 400 by spray pyrolysis, and an electron transport layer 600 is formed on a surface of the perovskite layer by spray pyrolysis.

(3) A plurality of cutting regions are formed by laser etching on the perovskite layer 500 and the electron transport layer 600 in a preset region, to expose the hole transport layer 400 in the preset region.

(4) Holes 900 are formed by laser cutting on the exposed hole transport layer 400, and part of the conductive layers 200 are exposed. A branch electrode 700 is formed in the holes 900 by magnetron sputtering.

(5) An electrode 800 connected to the branch electrode 700 is formed by passing through the electron transport layer 600 and the perovskite layer 500.

In the solar cell module, a height of the hole transport layer 400 is 5 nm, a height of the conductive layer 200 is 400 nm, and a height H of the formed branch electrode 700 is 30 nm.

Embodiment 2

Different from Embodiment 1, the cutting power is 80 kHz, the energy generated is 42 eV, and the height H of the formed branch electrode 700 is 10 nm.

Embodiment 3

Different from Embodiment 1, the cutting power is 80 kHz, the energy generated is 44 eV, and the height H of the formed branch electrode 700 is 50 nm.

Embodiment 4

Different from Embodiment 1, the cutting power is 80 kHz, the energy generated is 46 eV, and the height H of the formed branch electrode 700 is 100 nm.

Embodiment 5

Different from Embodiment 1, the cutting power is 80 kHz, the energy generated is 41 eV, and the height H of the formed branch electrode 700 is 5 nm.

Comparative Example 1

Different from Embodiment 1, after steps (1) and (2), the electron transport layer, the perovskite layer and the hole transport layer are cut to form the electrode 800.

Performance tests of Embodiments 1-5 and Comparative Example 1 are shown in Table 1 below.

Table 1 Comparison of Performance Parameters Between Embodiment 1 and Comparative Example 1

| Group | Height (nm) of branch electrode | One-dimensional size (pm) of branch electrode | Area ratio of cross section of branch electrode to cross section of electrode in perovskite layer | Short-circuit current (A) | Open-circuit voltage (V) | Filling factor (%) | Conversion efficiency (%) |
|---|---|---|---|---|---|---|---|
| Embodiment 1 | 30 | 1 | 0.3 | 2.1 | 1.12 | 80 | 18.82 |
| Embodiment 2 | 10 | 1 | 0.3 | 2.1 | 1.1 | 75 | 17.325 |
| Embodiment 3 | 50 | 1 | 0.3 | 2.2 | 1.1 | 75 | 18.15 |
| Embodiment 4 | 100 | 1 | 0.3 | 2.05 | 1.11 | 70 | 15.93 |
| Embodiment 5 | 5 | 1 | 0.3 | 2 | 1.09 | 73 | 15.914 |
| Comparative Example 1 | 0 | 1 | 0.3 | 2.0 | 1.1 | 65 | 14.3 |

As can be seen from Table 1, in the solar cell module manufactured according to Embodiments 1-4, the hole transport layer 400 has branch electrodes 700, and the branch electrodes 700 run through the hole transport layer 400 and contact interior of the conductive layers 200, which can effectively reduce series resistance of the solar cell module, improve charge transport capability, and increase the short-circuit density of the solar cell module as well as the filling factor, thereby effectively improving conversion efficiency of the perovskite solar cell module.

Upon comparison between Embodiment 1 and Embodiment 5, the height of the branch electrode 700 formed according to Embodiment 5 is not within the scope of the present disclosure, resulting in poor performance of the filling factor, which makes the conversion efficiency of the solar cell module lower than that in Embodiment 1.

Upon comparison between Embodiment 1 and Comparative Example 1, no branch electrode 700 is formed in Embodiment 1, with a main reason that sheet resistance of the hole transport layer is high, leading to poor performance of the filling factor, which makes the conversion efficiency of the solar cell module much lower than the solar cell module manufactured according to the present disclosure.

The above are only preferred embodiments of the present disclosure and are not intended to limit the present disclosure. For those skilled in the art, the present disclosure may have various modifications and variations. Any modifications, equivalent substitutions, improvements and the like made within the spirit and principle of the present disclosure should fall within the protection scope of the present disclosure.

Although the present disclosure has been disclosed as above with preferred embodiments, the claims should not be limited by those embodiments. Those skilled in the art may make possible changes and modifications to the present disclosure without departing from the conception of the present disclosure. Therefore, the protection scope of the present disclosure should be subject to the scope defined by the claims of the present disclosure.

What is claimed is:

1. A solar cell module, comprising:
   a substrate; and
   a plurality of conductive layers arranged on a surface of the substrate and separated from each other by an interval;
   wherein a plurality of solar sub-cells is provided on a surface of the conductive layer, and a plurality of grooves is provided between adjacent solar sub-cells of the plurality of solar sub-cells to separate the plurality of solar sub-cells from each other;
   each of the plurality of solar sub-cells comprises a hole transport layer, a perovskite layer and an electron transport layer that are stacked on the surface of the conductive layer;
   the hole transport layer of each of the plurality of solar sub-cells comprises a plurality of branch electrodes separated from each other, and each of the plurality of branch electrodes directly contacts an interior of the conductive layer; and
   the solar cell module further comprises an electrode, wherein the electrode successively passes through the electron transport layer and the perovskite layer and is connected to the plurality of branch electrode;

wherein a height of the branch electrode is set to H, a height of the hole transport layer is set to h1, a height of the conductive layer is set to h2, and the height H of the branch electrode, the height h1 of the hole transport layer and the height h2 of the conductive layer satisfy the following condition:

$$h1<H<h1+h2\times(10\%\text{-}60\%).$$

2. The solar cell module according to claim 1, wherein a shape of the branch electrode comprises at least one of a cone, a cylinder, a rectangle or an ellipse.

3. The solar cell module according to claim 1, wherein a one-dimensional size of the branch electrode is $0<L\leq 3$ μm.

4. The solar cell module according to claim 1, wherein an area ratio of a cross section of the branch electrode to a cross section of the electrode located in the perovskite layer is in a range from 0.1 to 0.3, and the cross section of the branch electrode is a cross section formed by the branch electrode on a surface of the hole transport layer.

5. The solar cell module according to claim 1, wherein a width of the electrode located in the perovskite layer is in a range from 50 μm to 200 μm.

6. A method for manufacturing a solar cell module, comprising:
providing a substrate and forming a plurality of conductive layers that are separated from each other on a surface of the substrate;
forming a plurality of solar sub-cells on a surface of the conductive layer, and forming a plurality of grooves between adjacent solar sub-cells of the plurality of solar sub-cells, wherein each of the solar sub-cells comprises a hole transport layer, a perovskite layer and an electron transport layer that are stacked on the surface of the conductive layer;
forming a plurality of branch electrodes that are separated from each other in the hole transport layer of each of the solar sub-cells so that the branch electrodes contact with an interior of the conductive layer; and
forming an electrode passing through the electron transport layer and the perovskite layer and connecting the electrode to the plurality of branch electrodes,
wherein the manufactured solar cell module comprises:
a substrate; and
a plurality of conductive layers arranged on a surface of the substrate and separated from each other by an interval;
wherein a plurality of solar sub-cells is provided on a surface of the conductive layer, and a plurality of grooves is provided between adjacent solar sub-cells of the plurality of solar sub-cells to separate the plurality of solar sub-cells from each other;
each of the plurality of solar sub-cells comprises a hole transport layer, a perovskite layer and an electron transport layer that are stacked on the surface of the conductive layer;
the hole transport layer of each of the plurality of solar sub-cells comprises a plurality of branch electrodes separated from each other, and each of the plurality of branch electrodes directly contacts an interior of the conductive layer; and
the solar cell module further comprises an electrode, wherein the electrode successively passes through the electron transport layer and the perovskite layer and is connected to the plurality of branch electrodes;

wherein a height of the branch electrode is set to H, a height of the hole transport layer is set to h1, a height of the conductive layer is set to h2, and the height H of the branch electrode, the height h1 of the hole transport layer and the height h2 of the conductive layer satisfy the following condition:

$$h1<H<h1+h2\times(10\%\text{-}60\%).$$

7. The method according to claim 6, wherein the step of forming a plurality of branch electrodes that are separated from each other in the hole transport layer of each of the solar sub-cells comprises:
forming a plurality of holes on the hole transport layer by a laser treatment to expose a part of the conductive layer, and forming the plurality of branch electrodes in the plurality of holes.

8. The manufacturing method according to claim 7, wherein a laser for the laser treatment comprises at least one of green light, ultraviolet light, reddish light or red light; and/or a frequency of the laser treatment is in a range from 60 kHz to 100 kHz.

9. A photovoltaic module, comprising a cover plate, a capsulation material layer and at least one solar cell string, wherein the at least one solar cell string comprises at least one solar cell module, and the solar cell module comprises:
a substrate; and
a plurality of conductive layers arranged on a surface of the substrate and separated from each other by an interval;
wherein a plurality of solar sub-cells is provided on a surface of the conductive layer, and a plurality of grooves is provided between adjacent solar sub-cells of the plurality of solar sub-cells to separate the plurality of solar sub-cells from each other;
each of the plurality of solar sub-cells comprises a hole transport layer, a perovskite layer and an electron transport layer that are stacked on the surface of the conductive layer;
the hole transport layer of each of the plurality of solar sub-cells comprises a plurality of branch electrodes separated from each other, and each of the plurality of branch electrodes directly contacts an interior of the conductive layer; and
the solar cell module further comprises an electrode, wherein the electrode successively passes through the electron transport layer and the perovskite layer and is connected to the plurality of branch electrodes;
wherein a height of the branch electrode is set to H, a height of the hole transport layer is set to h1, a height of the conductive layer is set to h2, and the height H of the branch electrode, the height h1 of the hole transport layer and the height h2 of the conductive layer satisfy the following condition:

$$h1<H<h1+h2\times(10\%\text{-}60\%).$$

10. The photovoltaic module according to claim 9, wherein the height H of the branch electrode is in a range from 2 nm to 500 nm.

11. The photovoltaic module according to claim 9, wherein a shape of the branch electrode comprises at least one of a cone, a cylinder, a rectangle or an ellipse.

12. The photovoltaic module according to claim 9, wherein a one-dimensional size of the branch electrode is $0<L\leq 3$ μm.

13. The photovoltaic module according to claim 9, wherein an area ratio of a cross section of the branch electrode to a cross section of the electrode located in the perovskite layer is in a range from 0.1 to 0.3, and the cross section of the branch electrode is a cross section formed by the branch electrode on a surface of the hole transport layer.

14. The photovoltaic module according to claim 9, wherein a width of the electrode located in the perovskite layer is in a range from 50 μm to 200 μm.

15. The photovoltaic module according to claim 9, wherein a width of a single solar sub-cell ranges from 5 mm to 8 mm.

16. The solar cell module according to claim 1, wherein the height H of the branch electrode is in a range from 2 nm to 500 nm.

17. The solar cell module according to claim 1, wherein a width of a single solar sub-cell ranges from 5 mm to 8 mm.

18. The solar cell module according to claim 1, wherein a serial resistance between adjacent solar sub-cells ranges from $2\ \Omega \cdot cm^2$ to $4\ \Omega \cdot cm^2$.

* * * * *